United States Patent [19]

Poletto

[11] Patent Number: 4,935,703
[45] Date of Patent: Jun. 19, 1990

[54] LOW BIAS, HIGH SLEW RATE OPERATIONAL AMPLIFIER

[75] Inventor: Vanni Poletto, Phoenix, Ariz.

[73] Assignee: SGS-Thomson Microelectronics, Inc., Carrollton, Tex.

[21] Appl. No.: 359,848

[22] Filed: May 31, 1989

[51] Int. Cl.[5] .............................................. H03F 3/45
[52] U.S. Cl. .................................... 330/255; 330/267
[58] Field of Search ............... 330/255, 261, 267, 273

[56] References Cited

U.S. PATENT DOCUMENTS

| | | | |
|---|---|---|---|
| 4,077,013 | 2/1978 | Morez et al. | 330/267 |
| 4,240,040 | 12/1980 | Saari | 330/255 |
| 4,317,083 | 2/1982 | Boyd | 330/296 |
| 4,331,930 | 5/1982 | Shibata et al. | 330/267 |
| 4,454,479 | 6/1984 | Spires | 330/263 |
| 4,455,674 | 6/1984 | Sano | 81/15 |
| 4,471,322 | 9/1984 | Yamaguchi et al. | 330/267 |
| 4,594,560 | 6/1986 | Dingwall et al. | 330/296 |
| 4,739,281 | 4/1988 | Doyle | 330/255 X |
| 4,837,523 | 6/1989 | Wright | 330/255 |

Primary Examiner—James B. Mullins
Attorney, Agent, or Firm—Richard K. Robinson; Kenneth C. Hill

[57] ABSTRACT

A bias current source for the output stage of an operational amplifier is controllable. The bias current generator senses the voltage differential on the differential operational amplifier inputs. When an input differential voltage is sensed which generates a rising output signal, additional bias current is provided to the output stage. When the output voltage is constant or falling, the bias current to the output stage is decreased.

5 Claims, 2 Drawing Sheets

LOW BIAS, HIGH SLEW RATE OPERATIONAL AMPLIFIER

BACKGROUND OF THE INVENTION

1. Field of the Invention:

The present invention relates generally to electronic circuits, and more particularly to monolithic integrated operational amplifier circuits.

2. Description of the Prior Art:

Operational amplifiers are quite commonly used in electronic circuit design. The circuits considered herein to be operational amplifiers generally are monolithic integrated circuits which implement a high gain amplifier having differential inputs. Variations are sometimes implemented, such as single input operational amplifiers having a second input tied internally to ground.

Operational amplifiers are available in a number of different designs which have been optimized for particular uses. Operational amplifiers emphasizing features such as high or lower power, fast response time, large bandwidth, or general purpose use, are available.

One useful design for an operational amplifier circuit is one that provides a low power drain combined with a high slew rate and good precision. The high slew rate would preferably be greater than approximately 40 V/microsecond, and provide a minimum amount of overshoot during the settling time.

Stability requirements for such a fast operational amplifier imply that a large phase margin, preferably greater than 60°, and large bandwidth be provided. In order to provide a good phase margin, it is preferable to avoid the use of Darlington transistor pairs in the output stage. A simple output stage is therefore preferred in fast operational amplifiers, but the constant current needed to bias such a simple output stage is relatively high. The bias current must be high enough so that the operational amplifier performs properly in the worst case, which occurs when high output currents are being sourced and a rising edge occurs. The relatively high bias currents needed to properly bias the output stage against this worst case are inconsistent with the need for a low power operational amplifier.

It would therefore be desirable to provide an operational amplifier which combines a high slew rate combined with low bias power requirements.

SUMMARY OF THE INVENTION

It is therefore an object of the present invention to provide a high slew rate operational amplifier.

It is another object of the present invention to provide such a high slew rate operational amplifier which has a low bias power required for the output stage.

It is a further object of the present invention to provide such a high slew rate operational amplifier in which the bias current to the output stage is controlled to provide a higher bias current only when needed.

Therefore, in accordance with the principles of the present invention, a bias current source for the output stage of an operational amplifier is controllable. The bias current generator senses the voltage differential on the differential operational amplifier inputs. When an input differential voltage is sened which generates an output signal changing in a selected direction, additional bias current is provided to the output stage. When the ouput voltage is constant or changing in the other direction, the bias current to the output stage is decreased.

BRIEF DESCRIPTION OF THE DRAWINGS

The novel features believed characteristic of the invention are set fourth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The operational amplifier described below provides a high slew rate amplifier with a simple output stage. In order to minimize the average bias current drain, bias current to the ouput stage is kept low. It is increased as needed only when operating conditions of the amplifier require a high output stage bias current. As is known in the art, a rising output voltage requires a higher bias current, and the amplifier described below increases the bias current at the time that the ouput signal is rising.

As is known in the art, the capacitive feedback loop used in operational amplifier causes them to act as integrators. It is desirable for the output stage bias circuit to predict those times at which higher bias current will be needed. Thus, the bias circuit senses the input differential voltage, which is the derivative of the output voltage. Since the bias current is controlled by the derivative of the output, rapid positive changes in the output voltage are accompanied by increased bias current. Regardless of its actual value, if the output voltage is not changing, the output stage bias current remains constant at a low value.

Figure 1:
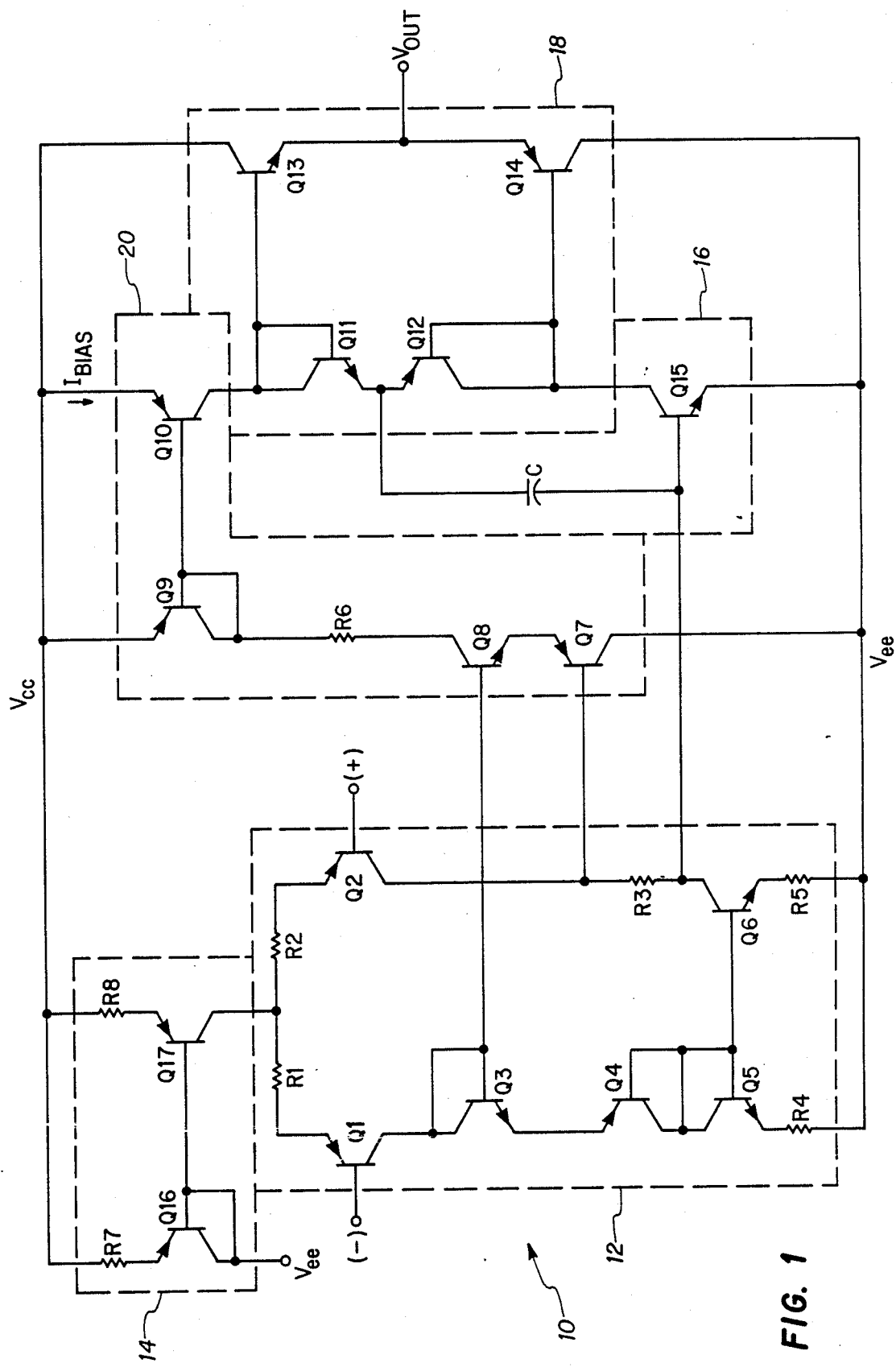
FIG. 1 is a schematic diagram of an operational amplifier according to the present invention.

Referring to FIG. 1, an operational amplifier 10 has a differential input stage 12. The differential input stage 12 is driven by a constant current source 14. The output of the differential input stage 12 drives a high gain amplifier with feedback 16. The high gain amplifier 16 in turn drives an output stage 18. Bias current for the output stage 18 is provided by an output stage bias current generator 20.

The differential input stage 12 includes matching transistors Q1 and Q2 which have base inputs connected to the inverting and noninverting operational amplifier inputs respectively. The collector and base of transistor Q3 are connected to the collector of Q1, and the emitter of Q3 is connected to the emitter of transistor Q4. The base and collector of Q4 are connected to the base and collector of Q5. The base of transistor Q6 is connected to the base of transistor Q5. Transistors Q5 and Q6 form a current mirror as known in the art.

Current limiting resistors R1 and R2 are connected to the emitters of transistors Q1 and Q2 respectively. Resistor R3 is connected to the collectors of transistors Q2 and Q6. Resistors R4 and R5 are connected between the negative voltage supply $V_{ee}$ and the emitters of transistors Q5 and Q6, respectively.

The output stage bias current generator 20 includes transistors Q7 and Q8. The base electrodes of transistors Q7 and Q8 are connected to the collectors of transistors Q2 and Q1 respectively. Resistor R6 operates to limit current through transistors Q7 and Q8. Transistors Q9 and Q10 form a current mirror, with the current through Q10 used to supply bias current to the output stage 18.

The ouput stage 18 includes transistors Q11 and Q12 connected to function as diodes. Complementary transistors Q13 and Q14 drive the output voltage $V_{out}$.

The signal used to drive the ouput stage 18 is provided by transistor Q15. Capacitor C is connected so as to provide feedback to Q15, and is connected between the base of Q15 and the common point between transisotrs Q11 and Q12. The current through capacitor C is a function of the derivative of the voltage signal across it. It is this property which, when used in a feedback loop with transistor Q15, causes the operational amplifier 10 generally to function as an integrater.

The constant current source 14 contains transistors Q16 and Q17 connected so as to form a current mirror. Resistors R7 and R8 have the same value so that the mirror is balanced. The current through transistor Q16 is constant so long as the supply voltages $V_{cc}$ and $V_{ee}$ do not vary. This means that the current through Q17 provided to the differential input stage 12, is also constant.

Operation of the circuit of FIG. 1 will now be described. The different operating conditions to be described are those which occur during a falling edge of the output signal, a rising output signal, and during a quiescent (steady) stage.

During a falling output edge, transistor Q2 is turned on, while Q1 is off. Since transistor Q1 is off, transistors Q7, Q8, Q9, and Q10 are also off. This means that no current $I_{bias}$ is supplied to the output stage 18 during a falling output edge. The slew rate of the operational amplifier is determined by the constant current in Q17 flowing through Q2, R3, and capacitor C. This is the same situation which occurs in a standard operational amplifier. As is known in the art, the falling edge slew rate for operational amplifiers is good because no bias current $I_{bias}$ is required.

When an output rising edge occurs, transistor Q2 is off, while Q1 is on. The constant current supplied by Q17 flows through Q1, Q3, Q5, and R4. This same current is mirrored in Q6 and R5. The current which flows through Q6 and R5 is supplied from the capacitor C.

Also in this situation, transistors Q7 and Q8 are turned on, causing current to flow through Q9. This current is mirrored in transistor Q10. The current through Q10, $I_{bias}$, will flow into the capacitor C and through transistor Q15. This ensures that transistor Q15 always remains on. With the relatively large value of $I_{bias}$ supplied through transistor Q10 under these conditions, the operational amplifier works in substantially the same manner as a standard operational amplifier which has a large, constant bias current. The difference is that Q10 does not drive a large bias current unless the ouput is rising.

In the quiescent state, the current through Q17 splits equally between transistors Q1 and Q2. The currents through transisotrs Q1 and Q2 also flow through the transistors connected directly or indirectly to their respective collector terminals. Resistors R4 and R5 help to get a lower input offset voltage.

It is preferable for all of the transisotrs Q1-Q10, and Q15, to to have the same gain and emitter area so that the currents which flow through them match. Under steady state conditions, summing the loop voltages in FIG. 1 provides the following equation:

$$V_{be3}+V_{be4}+V_{be5}+I_{c1}R4=V_{be8}+V_{be7}+I_{c2}R3+V_{be15}$$

The summation of the base-emitter voltages for transistors Q3 and Q5 must match those for Q8 and Q15. Also, $V_{be4}$ matches $V_{be7}$, and R4 matches R3. Since the transisotrs are the same size, the currents through them match, so that, for example, the collector currents through transistors Q3, Q8, and Q15 are the same. If the collector current through transisotr 15 tries to change, the base emitter voltage for Q15 also changes. The various voltages and currents in the loops mentioned above, by means of a feedback loop external to the operational amplifier, will bring the collector current for Q15 back to its proper value.

Figure 2A:
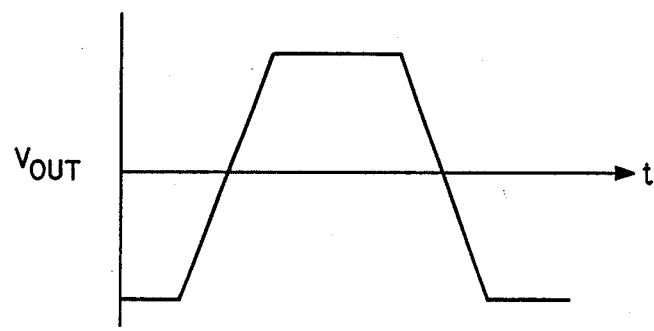
FIGS. 2a and 2b are a timing diagram illustrating selected voltages and currents during operation of the circuit of FIG. 1.
Figure 2B:
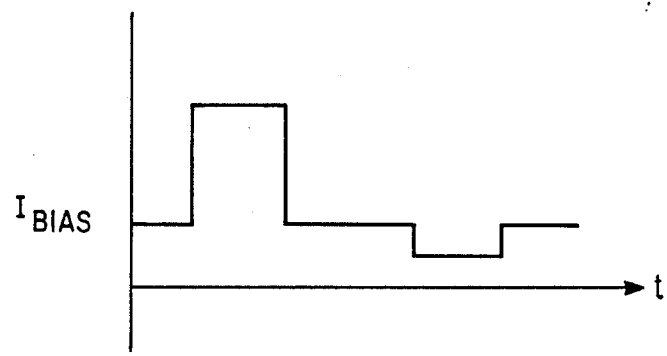

Referring to FIGS. 2a and 2b the relatonship between the changes in the output voltage $V_{out}$ and $I_{bias}$ are shown. FIG. 2a shows changes in the voltage $V_{out}$ with respect to time, and FIG. 2b shows the corresponding changes in $I_{bias}$. As described above, when $V_{out}$ is changing with a positive going edge, Q10 turns on and increases $I_{bias}$. During a falling edge, Q10 is turned off and $I_{bias}$ falls. Under steady state conditions, $I_{bias}$ is constant at a low value.

It can be seen from FIGS. 2a and 2b that the value of $I_{bias}$ is proportional to the slope of the output voltage curve. This occurs because the value of $I_{bias}$ is controlled by the voltage differential across the inputs, which is proportional to the derivative of the output voltage.

Various modifications can be made to the circuit described as will be apparent to those skilled in the art. For example, an MOS operational amplifier can be fabricated using circuitry analogous to that described herein. Implementation of equivalent MOS circuits given a bipolar circuit is well within the skill of those skilled in art.

In addition, modifications can be made to the bipolar circuit described. Details of the input differential amplifier may be changed, and such changes are encompassed within the scope of the invention. The output amplifier stage may be changed to one of many alternative output stages known in the art. Various alternative intermediate amplifier stages may also be substituted for the one shown and described herein.

While the invention has been particularly shown and described with reference to a preferred embodiment, it will be understood by those skilled in the art that various changes in form and detail may be made therein without departing from the spirit and scope of the invention.

I claim:
1. An operational amplifier, comprising:
   an input differential amplifier stage including parallel inverting and non-inverting input transistors connected to an inverting input and non-inverting input, respectively;
   an output amplifier stage for generating an output signal;
   means connected to said input stage and to said output stage for providing a first signal to said output stage which is proportional to the difference between signals applied to the inverting and non-inverting inputs;

complementary first and second sensing transistors connected in series, and connected to the inverting and non-inverting input transistors respectively, for receiving signals therefrom;

a first current mirror transistor connected in series with said sensing transistors; and a second current mirror transistor connected in parallel with said first current mirror transistor and in series with said output stage, wherein current flowing through said second current mirror transistor flows into said output stage to provide a bias current thereto, and wherein the current flowing through said second current mirror transistor has the same magnitude as a current flowing through said first current mirror transistor;

wherein the current flowing through said first current mirror transistor is controlled by the signals applied to said first and second sensing transistors.

2. The operational amplifier of claim 1, wherein said first signal providing means comprises:

an amplifying transistor connected to said input stage for amplifying a difference signal therefrom; and a capacitor connected to said amplifying transistor for providing a feedback path thereto.

3. The operational amplifier of claim 1 further comprising:

an input stage constant current source connected to said input stage, wherein current from said constant current source is directed through the parallel input transistors according to the relative values of the sinals applied to the inverting and non-inverting inputs.

4. The operational amplifier of claim 1, wherein all transistors are bipolar junction transistors.

5. The operational amplifier of claim 1, wherein said first signal providing means comprises an amplifier with capacitive feedback, wherein the first signal is an integral of a difference between the signals applied to the inverting and non-inverting inputs.

* * * * *